United States Patent [19]

Tanaka

[11] Patent Number: 5,011,705

[45] Date of Patent: Apr. 30, 1991

[54] PLASMA PROCESSING METHOD

[75] Inventor: Susumu Tanaka, Hachioji, Japan

[73] Assignee: Tel Sagami Limited, Kanagawa, Japan

[21] Appl. No.: 342,900

[22] Filed: Apr. 25, 1989

[30] Foreign Application Priority Data

Apr. 28, 1988 [JP] Japan .................................. 63-105924

[51] Int. Cl.⁵ .............................................. B05D 3/06
[52] U.S. Cl. .......................................... 427/39; 134/1;
  134/19; 134/22.1; 427/38; 427/47; 427/314;
  427/299
[58] Field of Search ...................... 427/47, 39, 38, 235,
  427/314, 309, 299; 134/1, 19, 22.1

Primary Examiner—Bernard Pianalto
Attorney, Agent, or Firm—Oblon, Spivak, McClelland, Maier, & Neustadt

[57] ABSTRACT

The method of the present invention for forming a high-quality thin film on a substrate comprises a step of introducing a cleaning gas into a treatment container, and a step of bringing the cleaning gas into a plasma state in an electric field and a magnetic field in the treatment container, thus cleaning the inside of the treatment container by the plasma. According to this method, impurities, which prevent a high-quality thin film from being formed on the surface of the substrate, can be completely eliminated in a short time period, thus allowing the formation of a high-quality thin film.

11 Claims, 2 Drawing Sheets

PLASMA PROCESSING METHOD

BACKGROUND OF THE INVENTION

1. Field of the Invention

The present invention relates to a plasma processing method, wherein the inner wall of a treatment container, the surface of a susceptor, the surface of a substrate, and the like, can be cleaned in a short time period, thereby to form a high-quality thin film.

2. Description of the Related Art

A CVD (chemical vapor deposition) method is widely known as a conventional method of forming a thin film on a substrate such as a semiconductor wafer. The CVD method is performed, for example, by employing a cold wall CVD apparatus. In the cold wall CVD apparatus, in order to suppress an undesirable deposition, a substrate is heated via a susceptor. FIG. 1 shows an example of the cold wall CVD apparatus. As shown in FIG. 1, the apparatus comprises a cylindrical vacuum container 1 having a stepped portion, and a cylindrical high-frequency electrode 5 connected to a high-frequency power source 6 and inserted into the inside of the vacuum container 1 through an opening formed in the bottom face of the vacuum container 1. A flange is provided on a lower peripheral portion of the high-frequency electrode 5. The flange is attached to the bottom face of the vacuum container 1 via an annular insulating member 8. An upper smaller-diameter portion of the container 1 serves as a gas introducing chamber 1a, and a lower larger-diameter portion of the container 1 serves as a treating chamber 1b. The upper face of the gas introducing chamber 1a is provided with gas introducing pipes 4 for introducing raw material gas into the container 1. The side face of the treating chamber 1b is provided with gas discharging pipes 9 for discharging the raw material gas. A susceptor 3 for mounting a substrate 2 thereon and heating the substrate 2 is arranged within the treating chamber 1b.

With use of the cold wall CVD apparatus shown in FIG. 1, a thin film is formed in the following manner. At first, the pressure within the vacuum container 1 is reduced to a predetermined value. The raw material gas for forming the thin film is introduced into the treating chamber 1b through the gas introducing pipes 4 and gas introducing chamber 1a. Then, the thin film is formed by a normal thermal CVD method. After the thin film is formed, the raw material gas is discharged through the gas discharging pipes 9.

In the above cold wall CVD apparatus, a process of cleaning the surface of the substrate is performed by using a plasma as a pre-treatment, in order to eliminate a spontaneous oxide film or the like from the surface of the substrate such as a semiconductor wafer. It is desirable that the spontaneous oxide film be completely removed from the surface of the substrate, since it acts as an electrical insulation film which is disadvantageous for achieving high-integration of 4 M or 16 M. Also, it is desirable that impurities be eliminated from the inner wall of the treatment container and the surface of the susceptor. There is a fear that such impurities may be adhered to the surface of the substrate, while the thin film is formed on the substrate. The cleaning process may be performed to eliminate impurities not only from the surface of the substrate but also from other parts. In general, the cleaning process is performed as follows. Namely, a chemically stable cleaning gas is introduced into the container 1, in lieu of the material gas. A high-frequency electric current is supplied to the high-frequency electrode 5, so that the gas introduced into the vacuum container 1 is brought into a plasma state. This plasma is used for etching the part to be cleaned, thus completing the cleaning process.

In general, in the above plasma treating apparatus, a large space is provided above the substrate in order to smooth the flow of the material gas, and to increase the ratio of the amount of material gas fed to the container to the amount of material gas consumed in the container. It is thus possible to obtain a uniform thickness and a uniform quality of the thin film. Because of this structure, a distance between the high-frequency electrode and the inner wall of the vacuum container corresponding to a ground electrode becomes large. Thus, when an electric field is generated between the high-frequency electrode and the inner wall of the vacuum container to produce a plasma, the intensity of the generated electric field is decreased. It is, therefore, difficult to obtain a high-energy plasma necessary for performing the etching process. This being the case, the cleaning of the substrate surface and susceptor surface cannot be completely performed, and the time necessary for the cleaning becomes longer. Therefore, the time required for the entire treating process becomes longer.

On the other hand, in the case of the plasma etching and the plasma CVD, a magnetic field is produced together with an electric field, thereby to easily produce a plasma and keep the produced plasma in a stable condition. For example, Japanese Patent Disclosure (Kokai) No. 56-48238 and Japanese Utility Model Publication No. 60-26094 disclose plasma treating apparatus wherein a permanent magnet or an electromagnet is embedded in an electrode. In addition, Japanese Patent Publication No. 59-27212 discloses a plasma reaction apparatus wherein a static magnetic field is applied across two opposite electrodes in parallel to the electrodes. Furthermore, Japanese Patent Disclosure (Kokai) No. 60-156547 discloses a plasma treating method wherein magnetic field is applied in a direction perpendicular to the flow of a plasma, and the plasma is irradiated onto an object in an oblique direction.

SUMMARY OF THE INVENTION

The object of the present invention is to provide a plasma processing method, wherein the inside of a treatment container and/or a substrate such as a semi-conductor wafer can be completely cleaned prior to the formation of a thin film on the substrate, thereby to form a high-quality thin film.

The plasma processing method of the present invention comprises the steps of:

introducing a cleaning gas into a treatment container; and producing a plasma from the cleaning gas in an electric field and a magnetic field in the treatment container, thus cleaning the inside of said treatment container by the plasma.

After the inside of the treatment container has been cleaned, a thin film can be formed on an object such as a semiconductor wafer in accordance with the conventional thin film forming method.

According to the method of this invention, after the cleaning of the inside of the treatment container has been completed, the surface of the substrate on which a thin film is to be formed can be cleaned. That is the present invention also provides a plasma processing method, comprising the steps of:

introducing a first cleaning gas into a treatment container;

generating an electric field and a magnetic field in the treatment container, thereby producing a first plasma from the first cleaning gas, and cleaning the inside of the treatment container by the first plasma;

discharging the first cleaning gas from the treatment container;

placing an object to be treated in the treatment container;

introducing a second cleaning gas into the treatment container;

generating an electric field and a magnetic field in the treatment container, producing a second plasma from the second cleaning gas, and cleaning the surface of the object by the plasma;

discharging the second cleaning gas from the treatment container;

introducing a raw material gas for forming a thin film into the treatment container; and forming a thin film on the surface of the object by the raw material gas.

According to this method, the inside of the treatment container and the surface of the substrate can be completely cleaned in a short time period. Thus, it is possible to form a thin film on the surface of the substrate after impurities which prevent the formation of a high-quality thin film are completely eliminated from the inside of the treatment container.

DETAILED DESCRIPTION OF THE PREFERRED EMBODIMENT

Figure 2:
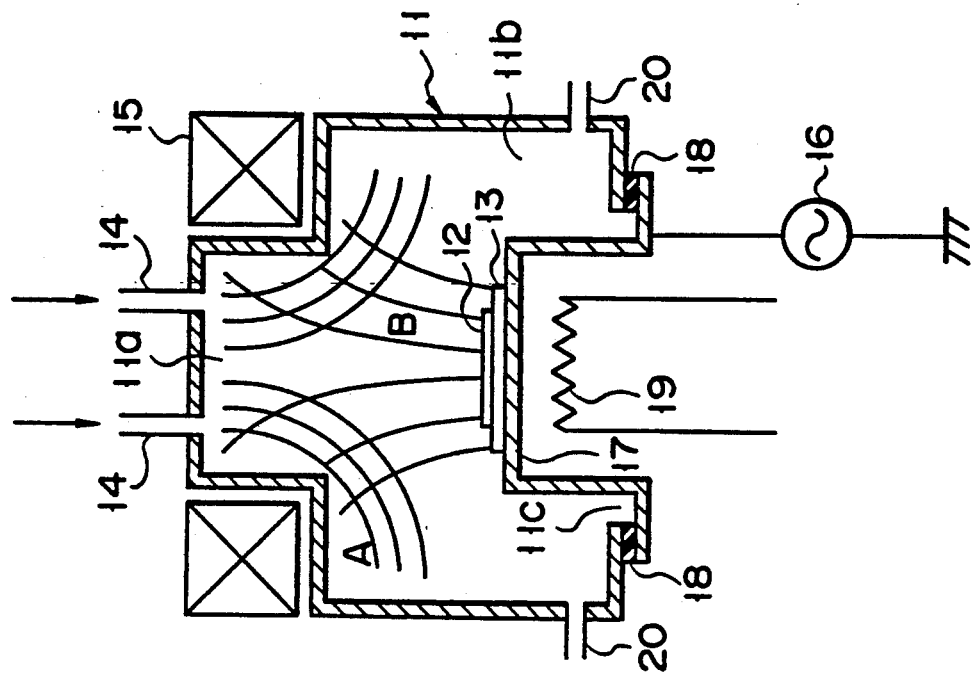
FIG. 2 is a cross section of a CVD apparatus applicable to the plasma processing method of the present invention.
Figure 1:
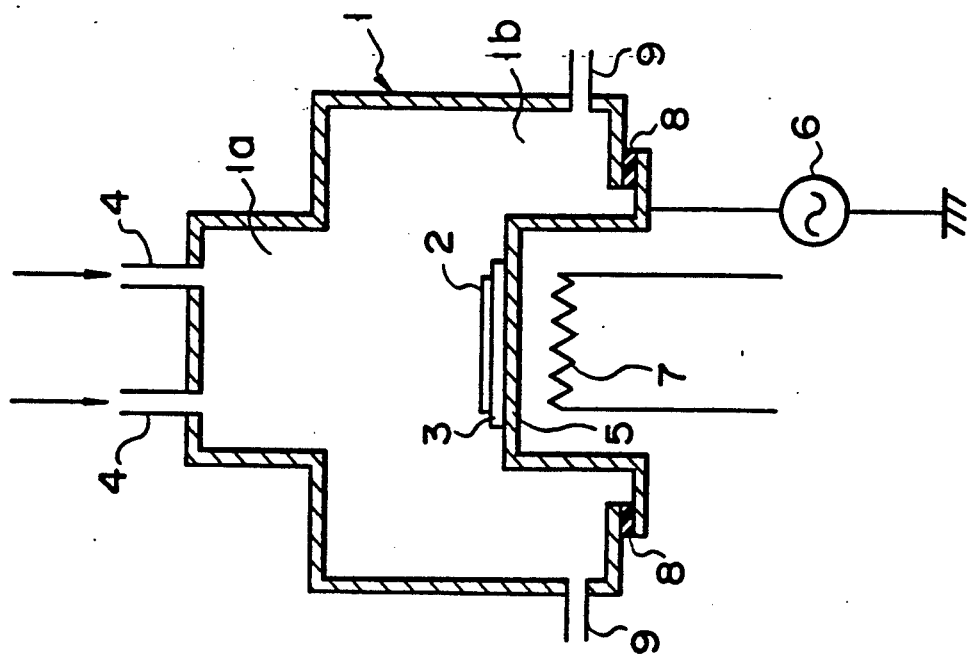
FIG. 1 is a cross section of a cold wall CVD apparatus applicable to a conventional thin film forming method.

In the plasma processing method of the present invention, a chemically stable inert gas or an etching gas may be used as a cleaning gas. Normally, argon gas is used as an inert gas. As an etching gas, SF6, NF3, CF4 may be used, and, in particular, NF3 is preferable.

In the cleaning step of the plasma processing method of this invention, a magnetic field as well as an electric field is produced in the treatment container, and their synergistic effect can produce a high-energy plasma.

The electric field can be produced, for example, by providing two electrodes in the treatment container. These electrodes may be plate-like electrodes. The treatment container itself may be used as one of the electrodes. It is desirable that an electric power of 100 W to 3 KW be applied to the electrodes in order to produce the electric field. Microwaves can be employed to produce the electric field, instead of using the electrodes. In the case of using microwaves, the microwaves are produced on the outside of the treatment container, and then introduced into the container.

In the treatment container, the magnetic field is produced such that at least part of the line of magnetic force of the magnetic field intersects at right angles with the line of electric force of the electric field. The magnetic field can be produced by, for example, a permanent magnet or an electromagnet. The intensity of the magnetic field is, normally, 30 to 300 Gauss. When a microwave of 2.45 GHz is used to produce the electric field, it is most desirable that the intensity of the magnetic field be 875 Gauss.

In a region where the line of the magnetic force intersects at right angles with the line of the electric force, the cycloid movement of electrons of gas molecules existing in this region occurs. The kinetic energy of the electrons converts the gas into a plasma. Thus, a high-energy plasma is produced.

By this cleaning step, the inside of the treatment container, including the inner wall of the treatment container and the susceptor, can be cleaned. In particular, the cleaning of the susceptor on which the substrate is mounted is very important for producing a high-quality thin film.

In the cleaning step, it is desirable that the object to be cleaned be heated at a high temperature in advance. The higher the temperature, the better the result. Specifically, a temperature of 500° C. or above is desirable. More preferably, the temperature should be 800° C. or above.

After the cleaning step has been completed, the cleaning gas is discharged from the treatment container. Then, raw material gas for forming a thin film is introduced into the treatment container. Several kinds of raw material gases may be used, depending on the type of the thin film to be formed. For example, when an Si film is formed on the substrate, $SiH_4$ gas or $Si(OC_2H_5)_4$ gas may be used.

The formation of a thin film on the substrate surface can be performed in a conventional manner.

According to the thin film forming method of the present invention, not only the inside of the treatment container, including the inner wall of the container and susceptor, but also the surface of the substrate can be cleaned. In cleaning the substrate surface, the substrate such as a semiconductor wafer is placed in the container and then the soft etching of the surface of the substrate is performed in like manner, after the cleaning of the inside of the treatment container.

Embodiments of the present invention will now be described with reference to the accompanying drawings.

At first, an apparatus applicable to the method of the present invention will be described.

FIG. 2 is a schematical cross section of an apparatus applicable to the method of this invention. As shown in FIG. 2, a cylindrical vacuum container 11 with a stepped portion includes an upper smaller-diameter portion and a lower larger-diameter portion. The upper smaller-diameter portion serves as a gas introducing chamber 11a, and the lower larger-diameter portion serves as a treating chamber 11b. The upper face of the gas introducing chamber 11a is provided with gas introducing pipes 14 for introducing gas into the vacuum container. When a cleaning process is performed, a cleaning gas is introduced through the gas introducing pipes 14, and when a thin film is formed, a material gas is introduced through the gas introducing pipes 14. A plurality of gas discharging pipes 20 for discharging gas are provided on the peripheral side face of the lower larger-diameter portion 11b, such that the discharging pipes 20 are included in a single circle defined on the peripheral side face of the lower portion 11b, and are on a level lower than the level of a susceptor 13. After the cleaning process or the film forming process, the gas is discharged through the pipes 20. The susceptor 13 for mounting a substrate 12 thereon and heating the same is arranged within the treating chamber 11b.

On the outside of the gas introducing chamber 11a, an annular magnetic coil 15 is provided substantially in parallel to the susceptor 13 provided in the vacuum container 11. The annular magnetic coil 15 produces a magnetic field in the vacuum container 11.

An opening 11c is formed in the bottom face of the vacuum container 11. A hollow cylindrical high-frequency electrode 17 is inserted into the vacuum container 11 through the opening 11c. A flange is provided on a lower peripheral portion of the hollow cylindrical high-frequency electrode 17. The flange is attached on the bottom face of the vacuum container 11 via an annular insulating member 18. The high-frequency electrode 17 is connected to a high-frequency power source 16. The susceptor 13 is mounted on the upper face of the high-frequency electrode 17. A heating mechanism, for example, a heating coil 19 for heating the susceptor 13 is arranged within the inner space of the hollow high-frequency electrode 17.

The plasma processing method using the above apparatus will now be described.

The pressure within the vacuum container 11 is reduced to a predetermined value, for example, $10^{-6}$ Torr, by an exhauster (not shown). Then, a cleaning gas such as $NF_3$ is introduced into the gas introducing chamber 11a through the gas introducing pipes 14.

An electric current is supplied to the annular magnetic coil 15 to produce a magnetic field A within the vacuum container 11. On the other hand, a high-frequency power is supplied to the high-frequency electrode 17 to produce an electric field B within the vacuum container 11. The frequency of the high-frequency power supplied to the high-frequency electrode 17 is, for example, 13.75 MHz. The line of magnetic force of the magnetic field A and the line of electric force of the electric field B intersect at right angles with one another at a given region. In this region, the cycloid movement of electrons of gas molecules existing there is caused by the synergistic effect of the magnetic field A and the electric field B. The kinetic energy of electrons due to the cycloid movement converts the cleaning gas ($NF_3$) into a plasma. A high-energy plasma is thus produced. The high-energy plasma is accelerated along the line of magnetic force of the magnetic field A, and impinges upon the inner wall of the vacuum container, susceptor 13, etc. The cleaning of the inside of the vacuum container 11 is performed by the impingement and the chemical reaction of the plasma.

In the case where the surface of the substrate is cleaned, after the cleaning of the inside of the vacuum container 11 has been completed in the above manner, the used cleaning gas is discharged through the gas discharging pipes 20. Then, the substrate 12 is mounted on the susceptor 13 arranged within the vacuum container 11. Thereafter, cleaning gas is once again introduced into the vacuum container 11 through the gas introducing pipes 14. After the gas is introduced, the cleaning of the substrate is performed in the same manner as described above.

After the completion of the cleaning, the used gas is discharged through the gas discharging pipes 20.

In the next step, a raw material gas selected depending on the thin film to be formed is introduced into the vacuum container 11 through gas introducing pipes 14. The film forming process is performed in a conventional manner. For example, the substrate 12 mounted on the susceptor 13 is heated by the heater 19 arranged within the inner space of the hollow high-frequency electrode 17, thereby to perform a thermal CVD process. Alternatively, a plasma CVD process may be employed for forming the thin film.

According to the above method, by virtue of the high energy of the produced plasma, the inside of the vacuum container 11 can be completely cleaned in a short time. Thus, a high-quality thin film can be formed on the substrate efficiently. The high-energy plasma is produced by the synergistic effect of the magnetic field A and the electric field B generated within the vacuum container 11. In a conventional cleaning process using a plasma, the distance between the high-frequency electrode 17 and the inner wall of the vacuum container 11 or the ground electrode was very important. However, according to the method of the present invention, this distance is not so important.

Figure 3:
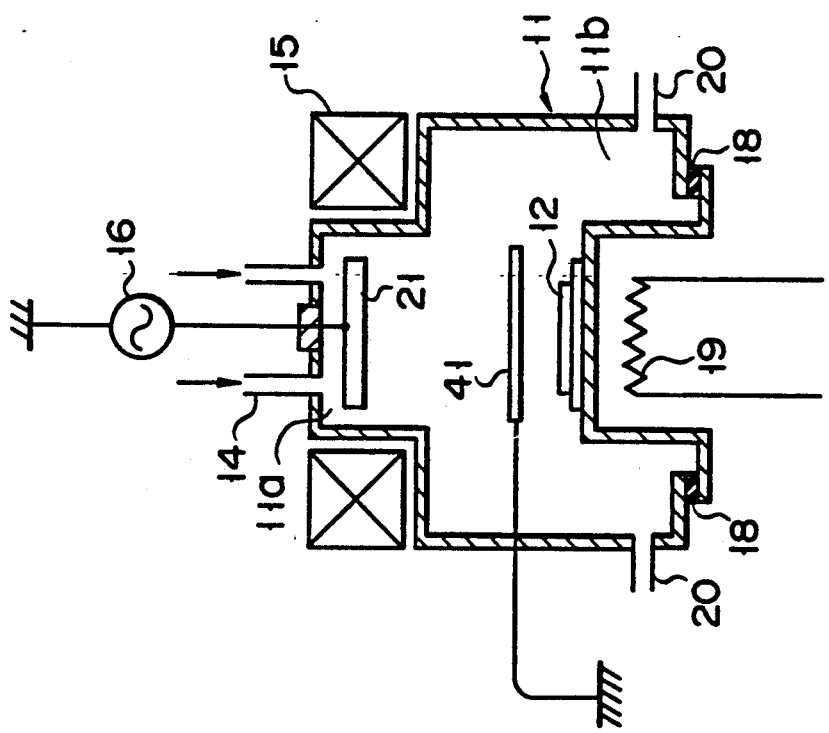
FIG. 3 is a cross section of another CVD apparatus applicable to the plasma processing method of the present invention.

Another apparatus is also applicable to the method of the present invention. FIG. 3 is a cross section of such an apparatus. In the apparatus of FIG. 2, the hollow cylindrical high-frequency electrode 17 is provided in the bottom region of the vacuum container 11. On the other hand, in the apparatus of FIG. 3, a plate-like high-frequency electrode 21 is provided in a central region of the annular magnetic coil 15. The high-frequency electrode 21 is also connected to the high-frequency power source 16. By arranging the plate-like electrode in this way, a stronger electric field can be generated. The apparatus shown in FIG. 3 can produce a higher-energy plasma. In addition, by providing a movable ground electrode 41 above the susceptor 13, as shown in FIG. 3, a further stronger electric field can be produced by the high-frequency electrode 21. When a thin film is formed by CVD, this movable ground electrode 41 is not necessary and is removed from the space above the susceptor 13.

Figure 4:
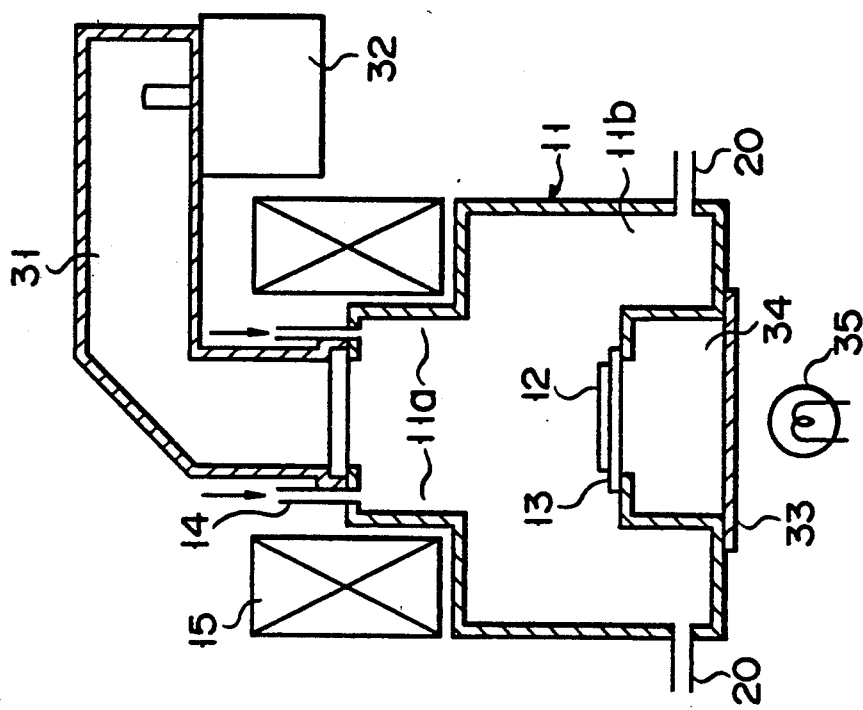
FIG. 4 is a cross section of still another CVD apparatus applicable to the plasma processing method of the present invention.

FIG. 4 is a cross section showing still another apparatus applicable to the plasma processing method of the present invention. The apparatus shown in FIG. 2 comprises the high-frequency electrode 17 for producing an electric field and the annular magnetic coil 15 for producing a magnetic field. On the other hand, the apparatus shown in FIG. 4 is provided with an electronic cyclotron resonance (ECR) plasma generation mechanism. More specifically, as shown in FIG. 4, one end portion of a microwave waveguide 31 is connected to the upper face of the gas introducing chamber 11a, and the other end of the microwave waveguide 31 is connected to a microwave generation mechanism 32. A microwave generated by the microwave generation mechanism 32 is propagated through the microwave waveguide 31 to the inside of the vacuum container 11.

An embodiment of the method of the present invention using the apparatus of FIG. 4 will now be described.

The pressure within the vacuum container 11 is reduced to a predetermined value, for example, $10^{-6}$ Torr, by an exhauster (not shown). Then, a cleaning gas such as $NF_3$ is introduced into the gas introducing chamber 11a through the gas introducing pipes 14.

A microwave having a frequency of, e.g., 2.45 GHz is generated from the microwave generation mechanism 32, and is propagated through the waveguide 31 to the vacuum container 11.

While the microwave is propagated into the vacuum container 11, an electric current is caused to flow through the annular magnetic coil 15 to produce a magnetic field in the vacuum container 11. In this case, the frequency of the microwave and the intensity of the magnetic field are set such that cycrotron resonance of electrons of gas molecules existing there occurs in the vacuum container 11. For example, when the frequency of the microwave is 2.45 GHz and the intensity of the magnetic field is 875 Gauss, the cycrotron resonance occurs. The electrons obtain a high kinetic energy by the cycrotron resonance, and produces a high-energy plasma. The inside of the vacuum container 11 is cleaned with use of the high-energy plasma.

In the case where the surface of the substrate is to be cleaned, after the cleaning of the inside of the vacuum container 11 has been completed in the above manner, the used gas is discharged through the gas discharging pipes 20. Then, the substrate 12 is mounted on the susceptor 13 within the vacuum container 11. Thereafter, a cleaning gas is introduced into the vacuum container once again through the gas introducing pipes 14, and the cleaning process is performed in the above manner.

After the cleaning of the surface of the substrate, the used gas is discharged through the gas discharging pipes 20. A raw material gas selected depending on the type of a thin film to be formed is supplied into the vacuum container 11 through the gas introducing pipes 14. Then, a conventional thin film forming process is performed.

As described above, the high-frequency electrode 17 used in the apparatus shown in FIG. 2 can be dispensed with, by using the ECR plasma generation mechanism. Thus, the design of the area near the susceptor 13 is made more flexible. For example, as shown in FIG. 4, a vacuum chamber 34 sealed by quartz glass 33 may be provided on the rear side of the susceptor 13, and a heat source 35 such as a halogen lamp or an infrared lamp may be provided on the outside of the vacuum container 11. In this case, the heat produced by the heat source 35 is transmitted to the susceptor 13 through the quarts glass 33.

What is claimed is:

1. A plasma processing method employed in a plasma processing apparatus wherein said apparatus comprises a susceptor with a surface for mounting an object to be treated within a treatment container, and means for forming an electric field within said treatment container such that said electric field creates lines of electric force which cross the mounting surface of the susceptor, said method comprising the steps of:
   arranging an annular coil for forming a magnetic field wherein said magnetic field has magnetic lines of force within said treatment container, wherein said coil is positioned so the axis of said coil substantially crosses said mounting surface of said susceptor; and the magnetic lines of force are generated at a place remote from said susceptor;
   introducing a cleaning gas into said treatment container; and
   forming said electric field and said magnetic field within said treatment container so as to generate plasma from said cleaning gas for cleaning the inner space of said treatment container with said plasman.

2. The method according to claim 1, wherein, in said cleaning step, said susceptor is heated at a temperature of 500° C. or above.

3. The method according to claim 1, wherein said electric field forming means comprises electric power ob between 100 and 3000 watts supplied to at least one elctrode, and the intensity of said magnetic field in said container is between 30 and 300 Gauss.

4. The method according to claim 1, wherein said axis of said annular magnetic coil is substantially perpendicular to said mounting surface of said susceptor.

5. The method according to claim 1, further comprising the steps of:
   discharging said gas used in said cleaning step from said treatment container;
   introducing said object to be treated into said treatment container;
   introducing a raw material gas, for forming a thin film, into said treatment container; and
   forming said thin film on a surface of said object.

6. The method according to claim 5, wherein the formation of said thin film on said object to be treated is performed by a thermal CVD process.

7. A plasma processing method employed in a plasma processing apparatus comprising a susceptor with a surface for mounting an object to be treated within a treatment container, and means for forming an electric field within said treatment container such that said electric field creates lines of electric force which cross said mounting surface of said susceptor, said method comprising the steps of:
   arranging an annular coil for forming a magnetic field wherein said magnetic field has magnetic lines of force within said treatment container, wherein said coil is positioned so the axis of said coil substantially crosses said mounting surface of said susceptor, and said magnetic lines of force are generated at a place apart from said susceptor;
   introducing a first cleaning gas into said treatment container;
   forming said electric field and said magnetic field within said treatment container so as to generate a first plasma from the first cleaning gas;
   cleaning the inner space of said treatment container with said first plasma;
   discharging said first gas from said treatment container;
   introducing said object to be treated into said treatment container;
   introducing a second cleaning gas into said treatment container;
   forming said electric field and said magnetic field within said treatment container so as to generate a second plasma from said second cleaning gas;
   cleaning a surface of said object with said second plasma;
   discharging said second gas from said treatment container;
   introducing a raw material gas for forming a thin film into said treatment container; and
   forming said thin film on said surface of said object.

8. The method according to claim 7, wherein, during cleaning by said first plasma, said susceptor is heated at a temperature of 500° C. or above, and, during cleaning by said second plasma, said object is heated at a temperature of 500° C. or above.

9. The method according to claim 7, wherein the formation of said thin film on said object is performed by a thermal CVD process.

10. The method according to claim 7, wherein said axis of said annular magnetic coil is substantially perpendicular to said mounting surface of said susceptor.

11. The method according to claim 7, wherein said electric field forming means comprises electric power supplied to at least one electrode of between 100 and 3000 Watts, and the intensity of said magnetic field in said container is 30 to 300 Gauss.

* * * * *